(12) United States Patent
Nam et al.

(10) Patent No.: US 9,221,957 B2
(45) Date of Patent: Dec. 29, 2015

(54) PATTERNING BY AREA SELECTIVE OXIDATION

(71) Applicant: Brookhaven Science Associates, LLC, Upton, NY (US)

(72) Inventors: Chang-Yong Nam, Coram, NY (US); Jovan Kamcev, Austin, TX (US); Charles T. Black, New York, NY (US); Robert Grubbs, Miller Place, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 0 days.

(21) Appl. No.: 14/576,479

(22) Filed: Dec. 19, 2014

(65) Prior Publication Data

US 2015/0175761 A1    Jun. 25, 2015

Related U.S. Application Data

(60) Provisional application No. 61/918,136, filed on Dec. 19, 2013.

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *C08J 7/12* | (2006.01) |

(52) U.S. Cl.
CPC .............. *C08J 7/123* (2013.01); *C08J 2353/00* (2013.01)

(58) Field of Classification Search
CPC .......................... H01L 2924/0002; C08J 7/123
USPC ............................................. 216/41; 438/694
See application file for complete search history.

(56) References Cited

U.S. PATENT DOCUMENTS

2010/0102415 A1* 4/2010 Millward et al. ............. 257/506

* cited by examiner

*Primary Examiner* — Roberts Culbert
(74) *Attorney, Agent, or Firm* — Dorene M. Price; Lars O. Husebo (57) ABSTRACT

Technologies are described for methods for producing a pattern of a material on a substrate. The methods may comprise receiving a patterned block copolymer on a substrate. The patterned block copolymer may include a first polymer block domain and a second polymer block domain. The method may comprise exposing the patterned block copolymer to a light effective to oxidize the first polymer block domain in the patterned block copolymer. The method may comprise applying a precursor to the block copolymer. The precursor may infuse into the oxidized first polymer block domain and generate the material. The method may comprise applying a removal agent to the block copolymer. The removal agent may be effective to remove the first polymer block domain and the second polymer block domain from the substrate, and may not be effective to remove the material in the oxidized first polymer block domain.

12 Claims, 5 Drawing Sheets

PATTERNING BY AREA SELECTIVE OXIDATION

CROSS REFERENCE TO RELATED APPLICATIONS

This application claims the benefit of U.S. Provisional Application No. 61/918,136 filed on Dec. 19, 2013, the content of which is incorporated by reference herein in its entirety.

The present application was made with Government support under contract number DE-AC02-98CH 10886 awarded by the U.S. Department of Energy. The United States government has certain rights in the invention(s).

FIELD OF THE INVENTION

This application relates to area selective oxidation of polymers for patterning materials.

BACKGROUND

Patterning of materials may be used for reducing size and scale of products in a manufacturing environment. Materials may be patterned by techniques such as dry etching, lithography, and evaporative-pattern casting. These techniques may produce patterns that guide the disposition or removal of materials at specific steps in a fabrication process.

SUMMARY

In some examples methods for producing a pattern of a material on a substrate are generally described. The methods may comprise receiving a sample, wherein the sample includes a patterned block copolymer on a substrate. The patterned block copolymer may include a first polymer block domain and a second polymer block domain. The methods may further comprise exposing the patterned block copolymer on the substrate to a light to generate an oxidized block copolymer on the substrate. The light may be effective to oxidize the first polymer block domain in the patterned block copolymer and the light may not be effective to oxidize the second polymer block domain in the patterned block copolymer. The methods may further comprise applying a precursor to the oxidized block copolymer on the substrate to generate a material on the substrate. The precursor may infuse into the oxidized first polymer block domain and generate the material in the first polymer block domain and the precursor may not infuse into the second polymer block domain. The methods may further comprise applying a removal agent to the oxidized block copolymer on the substrate to generate a patterned material on the substrate. The removal agent may be effective to remove the first polymer block domain and the second polymer block domain from the substrate, and may not be effective to remove the material in the oxidized first polymer block domain.

In some examples, a system effective to produce a pattern on a substrate is generally described. The system may comprise a chamber effective to receive a sample. The sample may include a patterned block copolymer on a substrate. The patterned block copolymer may include a first polymer block domain and a second polymer block domain. The system may further comprise a light source configured in communication with the chamber. The light source may be effective to apply light to the sample so that the light oxidizes the first polymer block domain in the patterned block copolymer and the light does not oxidize the second polymer block domain in the patterned block copolymer. The system may further comprise a source of precursor configured in communication with the chamber. The source of precursor may be effective to apply precursor to the sample so that the precursor infuses into the oxidized first polymer block domain and generate a material in the first polymer block domain and the precursor does not infuse into the second polymer block domain. The system may further comprise a source of removal agent configured in communication with the chamber. The source of removal agent may be effective to apply removal agent to the sample so that the removal agent removes the first polymer block domain and the second polymer block domain from the substrate, and does not remove the material in the first polymer block domain from the substrate.

In some examples, methods for producing a pattern of a material on a substrate are generally described. The methods may comprise receiving a sample. The sample may include a non-oxidized homopolymer on a substrate. The methods may further comprise exposing the homopolymer on the substrate to a light through a patterned mask to generate areas of oxidized homopolymer on the substrate and define non-oxidized areas homopolymer. The methods may further comprise applying a precursor to the homopolymer, including the areas of oxidized homopolymer and non-oxidized areas. The precursor may infuse into the areas of oxidized homopolymer on the substrate and generate the material in the oxidized homopolymer and the precursor may not infuse into the non-oxidized areas on the substrate. The methods may further comprise applying a removal agent to the homopolymer on the substrate to generate patterned material on the substrate. The removal agent may be effective to remove the homopolymer, but may not be effective to remove the material in the oxidized homopolymer from the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 3($a$) is a top view scanning electron microscopy (SEM) micrograph showing a self-assembled polystyrene-block-poly(methyl methacrylate) (PS-b-PMMA) thin film template with a cylindrical pattern;

FIG. 3($b$) is a top view SEM micrograph showing a self-assembled PS-b-PMMA thin film template with a lamellar pattern;

FIG. 3($c$) is a top view SEM micrograph showing an ultraviolet (UV)-irradiated self-assembled PS-b-PMMA thin film template with a cylindrical pattern after six diethylzinc (DEZ)/water infusion synthesis cycles using an atomic layer deposition system;

all arranged according to at least some embodiments described herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

It will be understood that any compound, material or substance which is expressly or implicitly disclosed in the specification and/or recited in a claim as belonging to a group or structurally, compositionally and/or functionally related compounds, materials or substances, includes individual representatives of the group and all combinations thereof.

Figure 1:
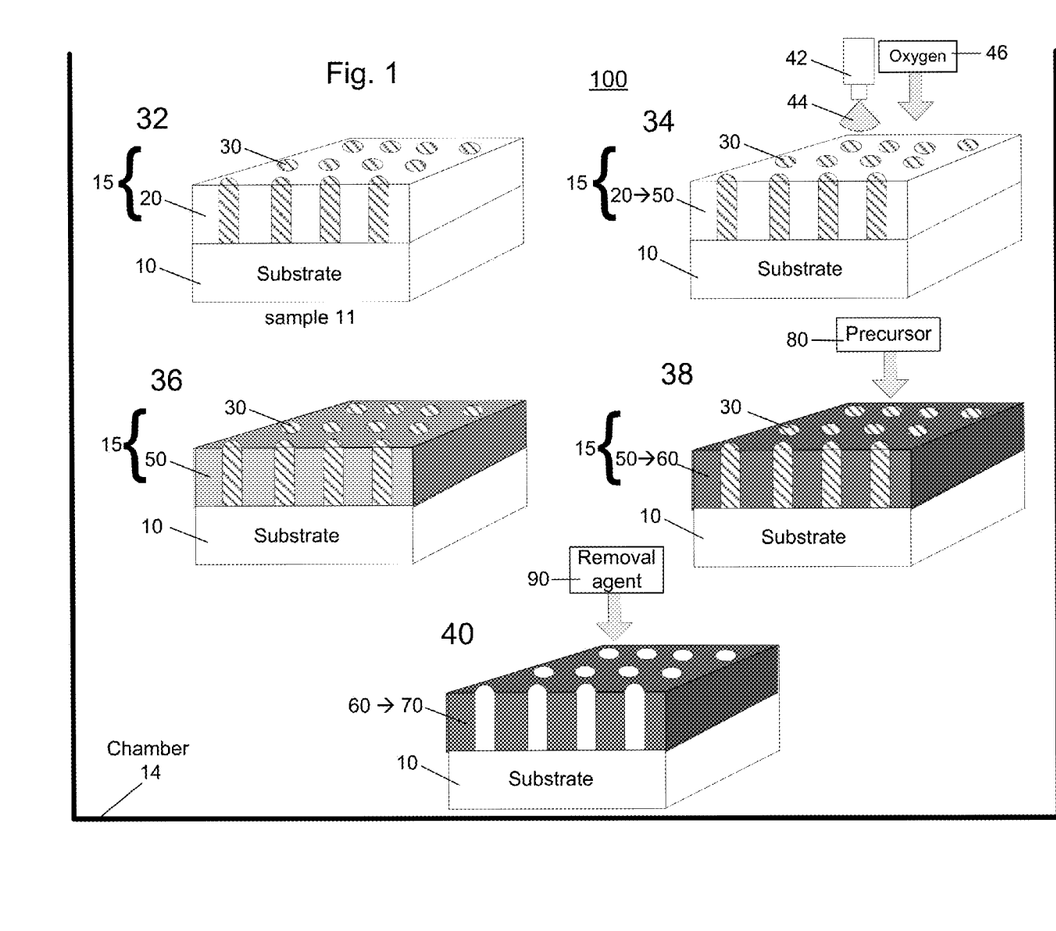
FIG. 1 illustrates an example of a system that can be utilized to implement patterning by area-selective oxidation on a block copolymer.

FIG. 1 illustrates an example system 100 that may be utilized to implement patterning by area-selective oxidation on a block copolymer, arranged in accordance with at least some embodiments presented herein. As discussed in more detail below, one polymer block in a block copolymer may be functionalized so that the polymer block can bond to a precursor that may not otherwise bond to the polymer block. System 100 may include a chamber 14 which may receive a sample 11.

As shown at 32, sample 11 may include a substrate 10 that may support a block copolymer 15. Substrate 10 may be, for example, inorganic semiconductor, organic semiconductor, plastic, oxide, metal, or any material upon which patterning is desired. Block copolymer 15 may be a diblock copolymer. Block copolymer may be about 20 nm to about 40 nm in thickness. Block copolymer 15 may include two domains. Polymer blocks 20 may define the first domain in block copolymer 15. Polymer blocks 30 may define the second domain in block copolymer 15. Polymer blocks 20 and 30 may be immiscible and may be bound together by covalent bonds. Block copolymer 15 may include a patterning of the first domain defined by polymer blocks 20 and second domain defined by polymer blocks 30. The pattern may be defined by a placement of mers of polymer block 20 and polymer block 30 within block copolymer 15. The pattern may be formed in block copolymer 15 as block copolymer 15 phase-separates to minimize available free energy. Nanostructure patterns and dimensions of polymer blocks 20 and 30 may be adjusted by adjusting molecular weight ratio between polymer block 20 and polymer block 30. Block copolymer 15 may, for example, be polystyrene-block-poly(methylmethacrylate) (PS-b-PMMA). The pattern of block copolymer 15, which is defined by the placement of mers of polymer blocks 20 and polymer blocks 30, may be cylindrical or lamellar.

Polymer blocks 20 and 30 in block copolymer 15 may each include respective characteristics and properties. The characteristics and properties of polymer block 20 may be different from the characteristics and properties of polymer block 30. For example, properties of polymer block 30 may include an affinity to a particular substance and properties of polymer block 20 may not include an affinity to the particular substance. Differences in characteristics and properties of polymer block 20 from polymer block 30 may allow block copolymer 15 to be used to generate a pattern on substrate 10.

As shown at 34, a light source 42 may emit a light 44 that is incident upon block copolymer 15, including polymer blocks 20 and 30. Light source 42 may be an ultraviolet (UV) light source. Light source 42 may be, for example, a 0.8 mW/cm$^2$ low pressure mercury lamp. UV light may have a wavelength smaller than 400 nm, such as for example 240 nm. Block copolymer 15 may be exposed to UV light 44 in an oxygen presence 46. Oxygen presence 46 may be, for example, a $N_2/O_2$ (98% $N_2$/2% $O_2$) atmosphere. Block copolymer 15 may be exposed to light 44 under oxygen presence 46 for about 5 minutes. Polymer blocks 20 and 30 in block copolymer 15 may include different characteristics and properties and may react differently under the same environmental condition. For example, polymer block 20 may oxidize when exposed to UV light 44 while polymer block 30 may not oxidize when exposed to UV light 44. Differences in characteristics and properties of polymer block 20 from polymer block 30 upon environmental exposures may also allow copolymer 15 to be used to generate a pattern on substrate 10, as discussed in more detail below.

As shown at 36, after UV exposure, block copolymer 15 may include oxidized polymer block 50 and non-oxidized polymer block 30. Oxidation due to UV exposure in polymer block 50 may enhance an ability of polymer block 50 to attract a substance such as a precursor. No oxidation due to UV exposure in polymer block 30 may result in no attraction for the substance to polymer block 30.

As shown at 38, a precursor 80 may be applied to block copolymer 15. Precursor 80 may be attracted to oxidized polymer block 50 and not attracted to non-oxidized polymer block 20. The attraction may be, for example, a Lewis Acid-Base attraction. Precursor 80 may penetrate oxidized polymer block 50 and infiltrate oxidized polymer block 50 due to the attraction. Infiltration of oxidized polymer block 50 by precursor 80 may form infused polymer block 60. Precursor 80 may enable or support synthesis of a structure or film. Precursor 80 may be an organometal. In some examples, precursor 80, may be diethylzinc (DEZ) a precursor for synthesis of zinc oxide (ZnO) films by chemical vapor deposition (CVD) or atomic layer disposition (ALD). In some examples, precursor 80 may be titanium isopropoxide (TIP), an organometallic precursor for synthesis of titanium dioxide ($TiO_2$). In some examples, precursor 80 may be trimethylaluminum (TMA), an organometallic precursor for synthesis of aluminum oxide ($Al_2O_3$).

Precursor 80 may be applied to block copolymer 15 more than once. Precursor 80 may be applied to block copolymer in a precursor cycle. The precursor cycle may include precursor 80 applied to block copolymer 15 followed by a second precursor 80 applied to block copolymer 15. Second precursor 80 may be water. A water precursor 80, applied after an organometal precursor 80, may provide oxygen for metal oxide formation. Multiple precursor cycles may be executed, for example, 2 to 10 precursor cycles, 3-5 precursor cycles, or 6 precursor cycles. In some examples, two or more different organometal precursors 80 may be applied to block copolymer 15. For example, two different organometal precursors may enable the synthesis of a binary compound.

Precursor 80 may be attracted to oxidized polymer block 50 due to photo-oxidation. Photo-oxidation may generate functional groups that include oxygen in polymer block 50. Precursor 80 may act as a Lewis acid and bind to the functional groups. The functional groups may act as a Lewis base in polymer block 50. Precursor 80, by infiltrating oxidized polymer block 50, may assume the pattern of oxidized polymer block 50 within a scaffold of polymer block 50, to produce infused polymer block 60. Precursor 80 may generate material 70 within infused polymer block 60. Precursor 80 may not infuse in polymer block 30.

At 40, a removal agent 90 may be applied to block copolymer 15, including infused polymer block 60 and polymer block 30. Removal agent 90 may be an oxygen plasma and oxygen plasma etching may be used to remove block copolymer 15 but not infused polymer block 60. Removal of block copolymer 15 may result in the generation of patterned material 70. Patterned material 70 may enable or support synthesis of a patterned structure or film.

In examples where precursor 80 is a diethylzinc (DEZ)/water precursor cycle, patterned material 70 may be a patterned ZnO template. As a patterned ZnO template, patterned material 70 may be utilized to produce patterned ZnO films by chemical vapor deposition (CVD) or atomic layer disposition (ALD) for use in detectors, transistors, electronics or any other application.

In examples where precursor 80 is a titanium isopropoxide (TIP)/water precursor cycle, patterned material 70 may be a patterned titanium dioxide ($TiO_2$) template. As a patterned $TiO_2$ template, patterned material 70 may be utilized to produce patterned $TiO_2$ films by chemical vapor deposition (CVD) or atomic layer disposition (ALD) for use in detectors, transistors, electronics or any other application.

In examples where precursor 80 is a trimethylaluminum (TMA)/water precursor cycle, patterned material 70 may be a patterned aluminum oxide ($Al_2O_3$) template. As a patterned $Al_2O_3$ template, patterned material 70 may be utilized to produce patterned $Al_2O_3$ films by chemical vapor deposition (CVD) or atomic layer disposition (ALD) for use in detectors, transistors, electronics or any other application.

Figure 2:
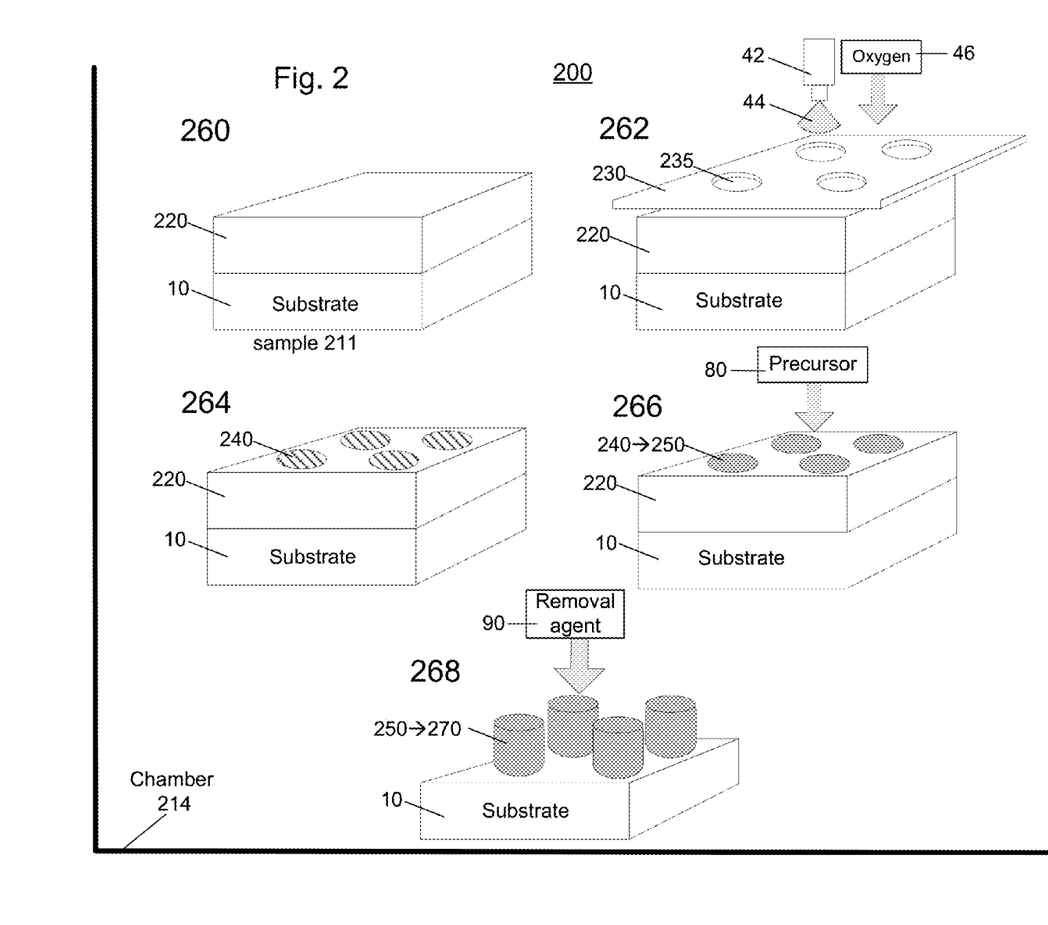
FIG. 2 illustrates an example of a system that can be utilized to implement patterning by area-selective oxidation on a homopolymer.

FIG. 2 illustrates an example of a system that can be utilized to implement patterning by area-selective oxidation on a homopolymer, arranged in accordance with at least some embodiments presented herein. Those components in FIG. 2 that are labeled identically to components of FIG. 1 will not be described again for the purposes of clarity. As discussed in more detail below, select areas in a homopolymer may be functionalized so that the select areas can bond to a precursor that may not otherwise bond to the homopolymer. System 200 may include a chamber 214 which may receive a sample 211.

As shown at 260, sample 211 may include a substrate 10 that may support a homopolymer 220. Substrate 10 may be, for example, silicon, metal, or any material upon which patterning is desired. Homopolymer 220 may include one repeating monomer. For example, homopolymer 220, may be polystyrene (PS) and include repeating styrene monomers.

As shown at 262, light source 42 may emit a light 44 through holes 235 defined by mask 230. Light 44 through holes 235 may be incident upon homopolymer 220. Light 44 may not be incident on homopolymer 220 at areas defined by mask 230. Light source 42 may be an ultraviolet (UV) light source. UV light may have a wavelength smaller than 400 nm, for example 240 nm. Light source 42 may be, for example, a 0.8 mW/$cm^2$ low pressure mercury lamp. Homopolymer 220, at areas defined by holes 235, may be exposed to UV light 44 under an oxygen presence 46. Oxygen presence 46 may be a $N_2/O_2$ (98/2) atmosphere. Homopolymer 220 may be exposed to light 44 under oxygen presence 46 for about 5 minutes. Homopolymer 220 may oxidize when exposed to UV light 44. Oxidation of homopolymer in areas defined by holes 235 may allow homopolymer 220 to be used to generate a pattern on substrate 10, as discussed in more detail below.

As shown at 264, after UV exposure, homopolymer 220 may include areas of oxidized homopolymer 240. Oxidation due to UV exposure in oxidized homopolymer 240 may enhance an ability of oxidized homopolymer 240 to attract a substance. Homopolymer 220 not exposed to UV light 44 may not oxidize and may not attract the substance to homopolymer 220.

As shown at 266, precursor 80 may be applied to homopolymer 220. Precursor 80 may be attracted to oxidized homopolymer 240 and not attracted to non-oxidized homopolymer 220. The attraction may be, for example, a Lewis Acid-Base attraction. Precursor 80 may penetrate oxidized homopolymer 240 and infiltrate oxidized homopolymer 240 due to the attraction. Infiltration of oxidized homopolymer 240 by precursor 80 may form infused homopolymer 250. Precursor 80 may enable or support synthesis of a structure or film. In some examples, precursor 80, may be diethylzinc (DEZ) a precursor for synthesis of zinc oxide (ZnO) films by chemical vapor deposition (CVD) or atomic layer disposition (ALD). In some examples, precursor 80 may be titanium isopropoxide (TIP), an organometallic precursor for synthesis of titanium dioxide ($TiO_2$). In some examples, precursor 80 may be trimethylaluminum (TMA), an organometallic precursor for synthesis of aluminum oxide ($Al_2O_3$).

Precursor 80 may be applied to homopolymer 220 including oxidized homopolymer areas 240 more than once. Precursor 80 may be applied to homopolymer 220 including oxidized homopolymer areas 240 in a precursor cycle. The precursor cycle may include precursor 80 applied to homopolymer 220, including oxidized homopolymer areas 240, followed by a second precursor 80 applied to homopolymer 220. Second precursor 80 may be water. A water precursor 80, applied after an organometal precursor 80, may provide oxygen for metal oxide formation. Multiple precursor cycles may be executed, for example, 2 to 10 precursor cycles, 3-5 precursor cycles, or 6 precursor cycles.

Precursor 80 may be attracted to oxidized homopolymer 240 due to photo-oxidation. Photo-oxidation may generate functional groups including oxygen in oxidized homopolymer 240. Precursor 80 may act as a Lewis acid and bind to the functional groups. The functional groups may act as a Lewis base in oxidized homopolymer 240. Precursor 80, by infiltrating oxidized homopolymer 240, may produce infused homopolymer 250. Precursor 80 may generate material 270 within infused homopolymer.

At 268, a removal agent 90 may be applied to homopolymer 220, including infused homopolymer 250. Removal agent 90 may be an oxygen plasma and oxygen plasma etching may be used to remove homopolymer 220 and may result in the generation of patterned material 270. Patterned material 270 may enable or support synthesis of a patterned structure or film.

In examples where precursor 80 is a diethylzinc (DEZ)/water precursor cycle, patterned material 270 may be a patterned ZnO template. As a patterned ZnO template, patterned material 270 may be utilized to produce patterned ZnO films by chemical vapor deposition (CVD) or atomic layer disposition (ALD) for use in detectors, transistors, electronics or any other application.

In examples where precursor 80 is a titanium isopropoxide (TIP)/water precursor cycle, patterned material 270 may be a patterned titanium dioxide ($TiO_2$) template. As a patterned $TiO_2$ template, patterned material 270 may be utilized to produce patterned $TiO_2$ films by chemical vapor deposition (CVD) or atomic layer disposition (ALD) for use in detectors, transistors, electronics or any other application.

In examples where precursor 80 is a trimethylaluminum (TMA)/water precursor cycle patterned material 70 may be a patterned aluminum oxide ($Al_2O_3$) template. As a patterned $Al_2O_3$ template, patterned material 70 may be utilized to produce patterned $Al_2O_3$ films by chemical vapor deposition (CVD) or atomic layer disposition (ALD) for use in detectors, transistors, electronics or any other application.

EXAMPLES

In some examples, self-assembled PS-b-PMMA copolymer thin film templates were formed. Both cylindrical-phase (molecular weight $M_n$=67 kg/mol, 70:30 PS/PMMA) and lamellar-phase ($M_n$=75 kg/mol, 50:50 PS/PMMA) materials were formed. The film thicknesses were ~30 nm. The films were formed by spin-casting from toluene (1 wt %) onto Silicon (Si) substrates and annealing at 205° C. for up to 5 hours (in vacuum). Perpendicular domain orientation in the copolymer layer was promoted by neutralizing the Si surface with a PS-b-PMMA random copolymer brush layer prior to application of the block copolymer film.

The self-assembled cylindrical patterned PS-b-PMMA displayed locally ordered hexagonal arrangements of cylindrical PMMA domains with ~20 nm mean diameter, arranged with ~40 nm average separation within a majority block PS matrix. The self-assembled lamellar patterned PS-b-PMMA copolymer displayed fingerprint patterns of alternating PS and PMMA domains with ~40 nm pitch and roughly 50% duty cycle.

The self-assembled cylindrical patterned PS-b-PMMA copolymer and the self-assembled lamellar patterned PS-b-PMMA copolymer films were each irradiated with UV light. The UV light irradiation was performed with a ~0.8 mW/cm$^2$ low pressure mercury lamp in a 98% $N_2$/2% $O_2$ atmosphere for about 5 minutes.

Diethylzinc (DEZ), a precursor for synthesis of ZnO films by chemical vapor deposition, was then applied to the irradiated patterned PS-b-PMMA copolymer films. DEZ was applied to the irradiated patterned PS-b-PMMA copolymer films in six cycles of DEZ (at 1.3 Torr for 300 seconds) and then water vapor (at ~5 Torr for 300 seconds). After the six DEZ/water cycles, the PS-b-PMMA copolymer was removed by oxygen plasma producing patterned ZnO.

The patterned ZnO was highly similar to PS-b-PMMA copolymer thin film templates. For example, the ZnO formed on the self-assembled cylindrical patterned PS-b-PMMA copolymer template produced patterned ZnO film fully perforated with holes having an average diameter of ~22 nm, a 10% increase from the cylindrical patterned PS-b-PMMA thin film template. The patterned ZnO film also had ~40 nm center to center spacing which is unchanged from the cylindrical PS-b-PMMA thin film template.

In another example, the ZnO formed on the self-assembled lamellar patterned PS-b-PMMA template produced stripe patterned ZnO films having ~21 nm line widths that were nearly identical to the lamellar PS-b-PMMA copolymer thin film template. The stripe patterned ZnO film had ~40 nm repeat periods which was unchanged from the lamellar PS-b-PMMA copolymer thin film template.

Figure 3A:
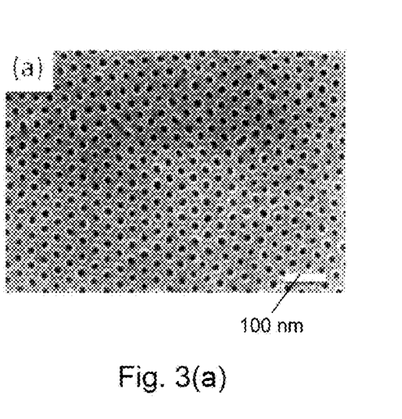
Figure 3B:
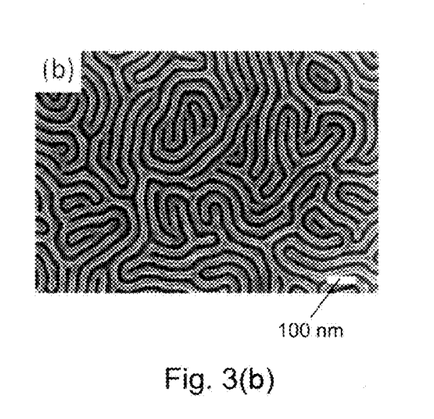

FIGS. 3(a)-(f) are scanning electron microscopy (SEM) micrographs showing self-assembled polystyrene-block-poly(methyl methacrylate) (PS-b-PMMA) thin film templates and corresponding nanostructured ZnO patterns created by block-selective growth using diethylzinc (DEZ) and water precursor cycle. All the micrographs include 100 nm scale bars. FIG. 3(a) is a top view SEM micrograph showing a self-assembled PS-b-PMMA thin film template with a cylindrical pattern. FIG. 3(b) is a top view SEM micrograph showing a self-assembled PS-b-PMMA thin film template with a lamellar pattern. In both FIG. 3(a) and FIG. 3(b) the PMMA domains of the block copolymer were removed and appear black to enhance the image contrast.

Figure 3C:
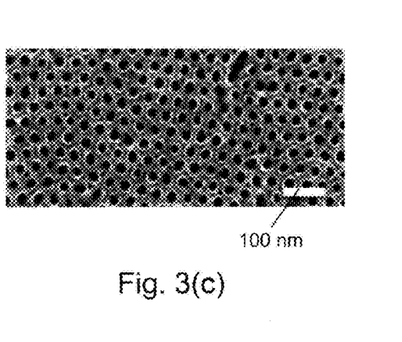

In FIG. 3(c), a top view of a SEM micrograph showing an ultraviolet (UV)-irradiated self-assembled PS-b-PMMA thin film template with a cylindrical pattern after six diethylzinc (DEZ)/water infusion synthesis cycles using an atomic layer deposition system is illustrated. FIG. 3(c) illustrates that the patterned ZnO is highly similar to FIG. 3(a). FIG. 3(c) illustrates the patterned ZnO film fully perforated with holes having an average diameter of ~22 nm, a 10% increase from the patterned PS-b-PMMA thin film template. FIG. 3(c) also illustrates the patterned ZnO film with ~40 nm center to center spacing which is unchanged from the PS-b-PMMA thin film template.

Figure 3D:
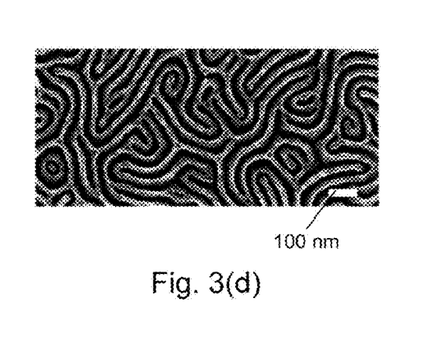
FIG. 3(d) is a top view SEM micrograph showing a UV-irradiated self-assembled PS-b-PMMA thin film template with a lamellar pattern after six DEZ/water infusion synthesis cycles using an atomic layer deposition system.

FIG. 3(d) is a top view SEM micrograph showing a UV-irradiated self-assembled PS-b-PMMA thin film template with a lamellar pattern after six DEZ/water infusion synthesis cycles using an atomic layer deposition system. FIG. 3(d) illustrates the patterned ZnO is highly similar to FIG. 3(b). FIG. 3(d) illustrates the stripe patterned ZnO film having ~21 nm line widths that are nearly identical to the PS-b-PMMA thin film template. FIG. 3(c) also illustrates the stripe patterned ZnO film with ~40 nm repeat period which is unchanged from the PS-b-PMMA thin film template.

Figure 3E:
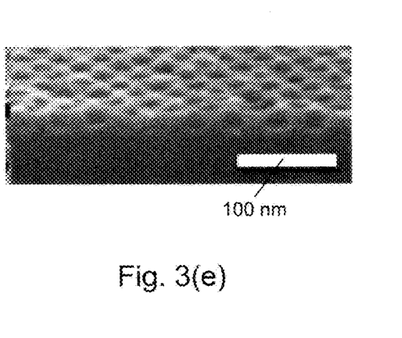
FIG. 3(e) is a side view SEM micrograph showing an ultraviolet (UV)-irradiated self-assembled PS-b-PMMA thin film template with a cylindrical pattern after infusion synthesis cycles using an atomic layer deposition system.

FIG. 3(e) is a side view SEM micrograph showing an ultraviolet (UV)-irradiated self-assembled PS-b-PMMA thin film template with a cylindrical pattern after infusion synthesis cycles using an atomic layer deposition system. FIG. 3(e) illustrates a 70% tilted cross-sectional view of FIG. 3(c). FIG. 3(e) illustrates a ZnO film ~24 nm thick, about 20% reduced when compared to the starting polymer template.

Figure 3F:
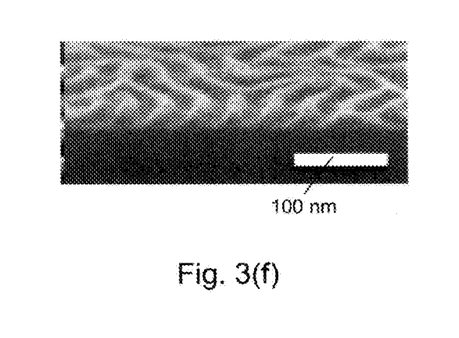
FIG. 3(f) is a side view SEM micrograph showing an UV-irradiated self-assembled PS-b-PMMA thin film template with a lamellar pattern after six DEZ/water infusion synthesis cycles using an atomic layer deposition system.

FIG. 3(f) is a side view SEM micrograph showing an UV-irradiated self-assembled PS-b-PMMA thin film template with a lamellar pattern after six DEZ/infusion synthesis cycles using an atomic layer deposition system. FIG. 3(f) illustrates a 70% tilted cross-sectional view of FIG. 3(d).

Figure 4:
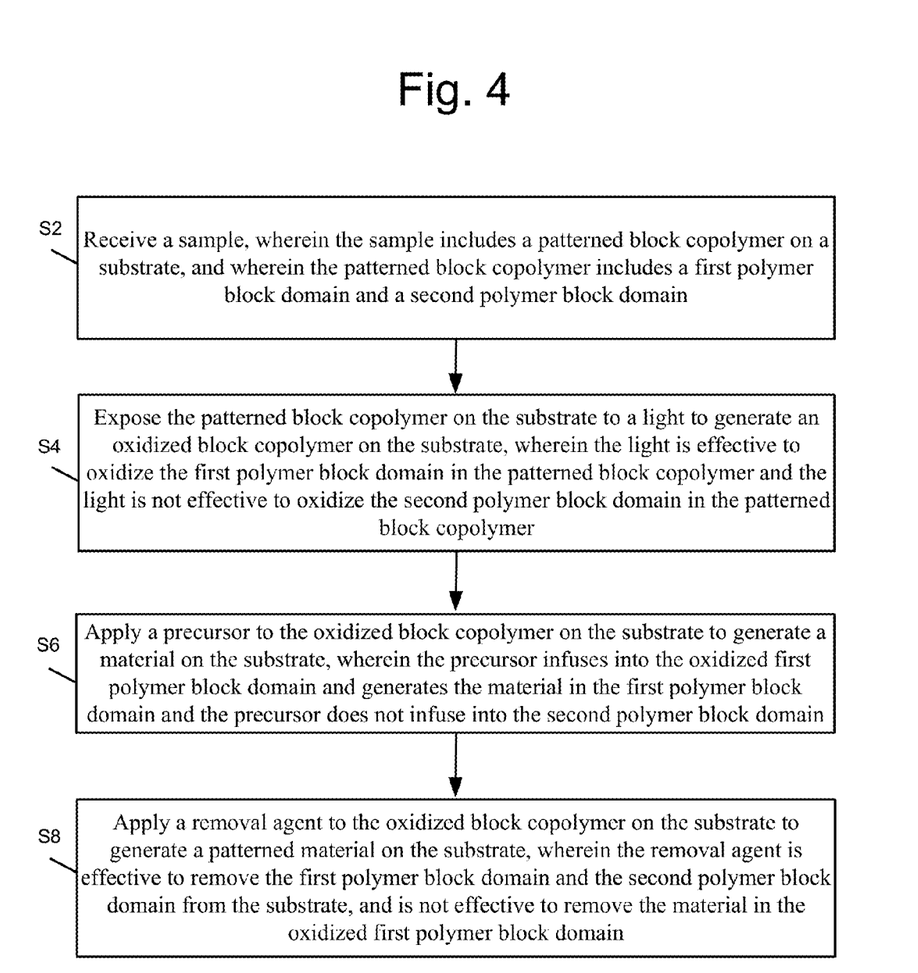
FIG. 4 illustrates a flow diagram of an example process for patterning by area selective oxidation utilizing a block copolymer.

FIG. 4 illustrates a flow diagram of an example process for patterning by area selective oxidation utilizing a block copolymer, arranged in accordance with at least some embodiments presented herein. The process in FIG. 4 could be implemented using, for example, system 100 discussed above and may be used to output a merged image. An example process may include one or more operations, actions, or functions as illustrated by one or more of blocks S2, S4, S6, and/or S8. Although illustrated as discrete blocks, various blocks may be divided into additional blocks, combined into fewer blocks, or eliminated, depending on the desired implementation.

Processing may begin at block S2, "Receive a sample, wherein the sample includes a patterned block copolymer on a substrate, and wherein the patterned block copolymer includes a first polymer block domain and a second polymer block domain." At block S2, a patterned block copolymer on a substrate it received. The patterned block copolymer includes a first polymer block domain and a second polymer block domain.

Processing may continue from block S2 to block S4, "Expose the patterned block copolymer on the substrate to a light to generate an oxidized block copolymer on the substrate, wherein the light is effective to oxidize the first polymer block domain in the patterned block copolymer and the light is not effective to oxidize the second polymer block domain in the patterned block copolymer." At block S4, the patterned block copolymer is exposed to light effective to oxidize the first polymer block domain. The light is not effective to oxidize the second polymer block domain. In some examples, the light may be UV light. The patterned block copolymer may be exposed to the light under an oxygen presence. In some examples, the oxygen presence may be a $N_2/O_2$ (98% $N_2$/2% $O_2$) atmosphere. In some examples, the patterned block copolymer may be exposed to the light under the oxygen presence for about 5 minutes.

Processing may continue from block S4 to block S6, "Apply a precursor to the oxidized block copolymer on the substrate to generate a material on the substrate, wherein the precursor infuses into the oxidized first polymer block domain and generates the material in the first polymer block domain and the precursor does not infuse into the second polymer block domain." At block S6 a precursor may be applied to the oxidized block copolymer. The precursor may be applied to the oxidized block copolymer more than once. In some examples, the precursor may be applied to the oxidized block copolymer in a precursor cycle. In some examples, the precursor cycle may include the precursor applied to the oxidized block copolymer followed by a second precursor applied to the oxidized block copolymer. In some examples, water may be the second precursor. Multiple precursor cycles may be executed, for example, 2 to 10 precursor cycles, 3-5 precursor cycles, or 6 precursor cycles.

The precursor may be attracted to the oxidized polymer block domain due to photo-oxidation. Photo-oxidation may generate functional groups that include oxygen in the oxidized polymer block domain. The precursor may act as a Lewis acid and bind to the functional groups. The functional groups may act as a Lewis base in the oxidized polymer block domain. The precursor may infiltrate the oxidized polymer block domain. By infiltrating the oxidized polymer block domain, the precursor may assume the pattern of the oxidized polymer block domain.

In some examples, the precursor, may be diethylzinc (DEZ)/water precursor cycle, a precursor for synthesis of zinc oxide (ZnO) films by chemical vapor deposition (CVD) or atomic layer disposition (ALD). In some examples, the precursor may be titanium isopropoxide (TIP)/water precursor cycle, an organometallic precursor for synthesis of titanium dioxide ($TiO_2$). In still other examples, the precursor may be trimethylaluminum (TMA)/water precursor cycle, an organometallic precursor for synthesis of aluminum oxide ($Al_2O_3$).

Processing may continue from block S6 to block S8, "Apply a removal agent to the infused block copolymer on the substrate to generate a patterned material on the substrate, wherein the removal agent is effective to remove the first polymer block domain and the second polymer block domain from the substrate, and is not effective to remove the material in the oxidized first polymer block domain." At block S8, a removal agent is applied to the infused block copolymer. The removal agent may be effective to remove the first polymer block domain and the second polymer block domain from the substrate. The removal agent may not be effective to remove the material in the oxidized first polymer domain.

In some examples, the removal agent may be an oxygen plasma. The removal may be done by oxygen plasma etching. The removal agent may be used to remove the first and second polymer block domains of the patterned block copolymer from the substrate. The removal of the first and second polymer block domains from the substrate may result in the generation of patterned material on the substrate. In some examples, the patterned material may enable or support synthesis of a patterned structure or film.

Figure 5:
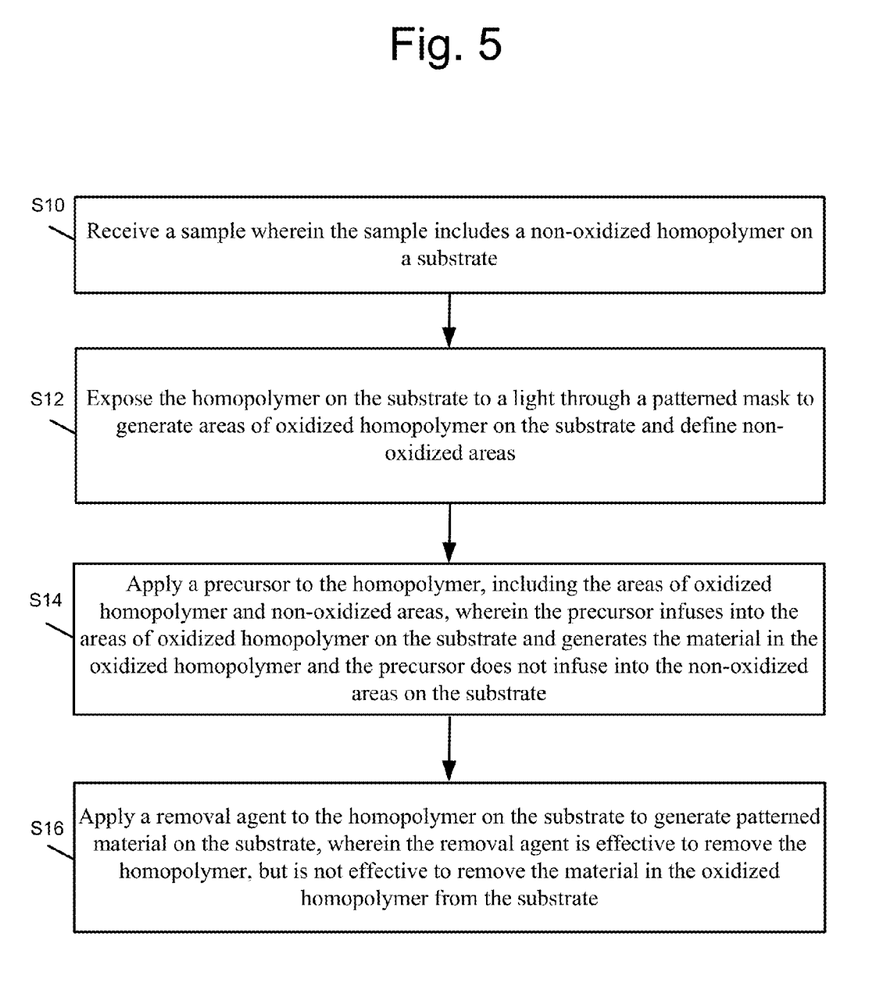
FIG. 5 illustrates a flow diagram of an example process for patterning by area selective oxidation utilizing a homopolymer.

FIG. 5 illustrates a flow diagram of an example process for patterning by area selective oxidation utilizing a homopolymer, arranged in accordance with at least some embodiments presented herein. The process in FIG. 5 could be implemented using, for example, system 200 discussed above and may be used to output a merged image. An example process may include one or more operations, actions, or functions as illustrated by one or more of blocks S10, S12, S14, and/or S16. Although illustrated as discrete blocks, various blocks may be divided into additional blocks, combined into fewer blocks, or eliminated, depending on the desired implementation.

Processing may begin at block S10, "Receive a sample wherein the sample includes a non-oxidized homopolymer on a substrate." At block S10, a non-oxidized homopolymer on a substrate it received.

Processing may continue from block S10 to block S12, "Expose the homopolymer on the substrate to a light through a patterned mask to generate areas of oxidized homopolymer on the substrate and define non-oxidized areas homopolymer." At block S14, the homopolymer is exposed to light through a patterned mask effective to oxidize the homopolymer. The light through the patterned mask generates areas of oxidized homopolymer and defines non-oxidized areas.

In some examples, the light may be UV light. The homopolymer may be exposed to the light under an oxygen presence. In some examples, the oxygen presence may be a $N_2/O_2$ (98% $N_2$/2% $O_2$) atmosphere. In some examples, the homopolymer may be exposed to the light under the oxygen presence for about 5 minutes.

Processing may continue from block S12 to block S14, "Apply a precursor to the homopolymer, including the areas of oxidized homopolymer and non-oxidized areas, wherein the precursor infuses into the areas of oxidized homopolymer on the substrate and generates the material in the oxidized homopolymer and the precursor does not infuse into the non-oxidized areas on the substrate." At block S14, a precursor may be applied to the homopolymer. The precursor may be applied to the homopolymer more than once. In some examples, the precursor may be applied to the homopolymer in a precursor cycle. In some examples, the precursor cycle may include the precursor applied to the homopolymer followed by a second precursor applied to the homopolymer. In some examples, water may be the second precursor applied in a precursor cycle. Multiple precursor cycles may be executed, for example, 2 to 10 precursor cycles, or 6 precursor cycles.

The precursor may be attracted to the oxidized homopolymer due to photo-oxidation. Photo-oxidation may generate functional groups that include oxygen in the oxidized homopolymer. The precursor may act as a Lewis acid and bind to the functional groups. The functional groups may act as a Lewis base in the oxidized homopolymer. The precursor may infiltrate the oxidized homopolymer. By infiltrating the oxidized homopolymer, the precursor may assume the pattern of the oxidized homopolymer.

In some examples, the precursor may be a diethylzinc (DEZ)/water precursor cycle for synthesis of zinc oxide (ZnO) films by chemical vapor deposition (CVD) or atomic layer disposition (ALD). In some examples, the precursor may be a titanium isopropoxide (TIP)/water precursor cycle, for synthesis of titanium dioxide ($TiO_2$). In still other examples, the precursor may be a trimethylaluminum (TMA)/water precursor cycle, for synthesis of aluminum oxide ($Al_2O_3$).

Processing may continue from block S14 to block S16, "Apply a removal agent to the homopolymer on the substrate to generate patterned material on the substrate, wherein the removal agent is effective to remove the homopolymer, but is not effective to remove the material in the oxidized homopolymer from the substrate." At block S16, a removal agent is applied to the homopolymer on the substrate. The removal agent may be effective to remove the homopolymer, but may not be effective to remove the material in the oxidized homopolymer.

In some examples, the removal agent may be an oxygen plasma. The removal may be done by oxygen plasma etching. The removal agent may be used to remove the homopolymer, including the areas of the oxidized homopolymer, from the substrate. The removal of the homopolymer, including the areas of the oxidized homopolymer, from the substrate may result in the generation of patterned material on the substrate. In some examples, the patterned material may enable or support synthesis of a patterned structure or film.

Among other possible benefits, a system in accordance with the present disclosure may provide a method for patterning precursors with pattern features of block copolymers about 20 nm in size. A system may pattern material with block copolymers with which the precursors only weakly interact. Area-select oxidation may enhance the attraction between a domain of a block copolymer with a precursor which may not have had an attraction to the domain of the block copolymer. For example, DEZ weakly interacts with PS-b-PMMA but is attracted to the PS domain when PS-b-PMMA is exposed to UV light and the PS domain is oxidized.

A system in accordance with the present disclosure may prevent the need to seed the block copolymer with a material suitable for block-selective growth. Not needing to seed the block copolymers will eliminate the seeding step in the process, eliminate the extra cost of the seeding material, and prevent negative properties of the seeding material from affecting the patterned precursor. For example, $Al_2O_3$ is a seeding material used with block copolymers which can limit the application of the created material patterns in electrical devices due to high electrical resistivity.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method for producing a pattern of a material on a substrate, the method comprising:
 receiving a sample, wherein the sample includes a patterned block copolymer on a substrate, and wherein the patterned block copolymer includes a first polymer block domain and a second polymer block domain;
 exposing the patterned block copolymer on the substrate to a light to generate an oxidized block copolymer on the substrate, wherein the light is effective to oxidize the first polymer block domain in the patterned block copolymer and the light is not effective to oxidize the second polymer block domain in the patterned block copolymer;
 applying a precursor to the oxidized block copolymer on the substrate to generate a material on the substrate, wherein the precursor infuses into the oxidized first polymer block domain and generates the material in the first polymer block domain and the precursor does not infuse into the second polymer block domain;
 applying a removal agent to the oxidized block copolymer on the substrate to generate a patterned material on the substrate, wherein the removal agent is effective to remove the first polymer block domain and the second polymer block domain from the substrate, and is not effective to remove the material in the oxidized first polymer block domain.

2. The method of claim 1, further comprising, prior to receiving the sample;
 producing the patterned block copolymer on the substrate, wherein the pattern is controlled by adjusting a molecular weight ratio between a first polymer block that corresponds to the first polymer block domain and a second polymer block that corresponds to the second polymer block domain.

3. The method of claim 2, wherein the patterned block copolymer has a cylindrical pattern.

4. The method of claim 2, wherein the patterned block copolymer has a lamellar pattern.

5. The method of claim 1, wherein:
 the block copolymer is polystyrene-block-poly(methyl methacrylate) (PS-b-PMMA);
 polystyrene is the first polymer block domain; and
 poly(methyl methacrylate) is the second polymer block domain.

6. The method of claim 1, wherein the light is ultraviolet (UV) light with a wavelength smaller than 400 nm.

7. The method of claim 1, further comprising exposing the patterned block copolymer on the substrate to a light with a wavelength of about 240 nm under a 98% $N_2$/2% $O_2$ atmosphere for about 5 minutes.

8. The method of claim 1, wherein the precursor is applied in a precursor cycle and includes diethylzinc (DEZ) and water.

9. The method of claim 1, wherein the precursor is applied in a precursor cycle and includes titanium isopropoxide (TIP) and water.

10. The method of claim 1, wherein the precursor is applied in a precursor cycle and includes trimethylaluminum (TMA) and water.

11. The method of claim 1, wherein the removal agent is an oxygen plasma and the method further comprises removing the first polymer block domain and the second polymer block domain from the substrate by oxygen plasma etching.

12. A method for producing a pattern of material on a substrate, the method comprising:

receiving a sample wherein the sample includes a non-oxidized homopolymer on a substrate;

exposing the homopolymer on the substrate to a light through a patterned mask to generate areas of oxidized homopolymer on the substrate and define non-oxidized areas;

applying a precursor to the homopolymer, including the areas of oxidized homopolymer and non-oxidized areas, wherein the precursor infuses into the areas of oxidized homopolymer on the substrate and generates the material in the oxidized homopolymer and the precursor does not infuse into the non-oxidized areas on the substrate;

applying a removal agent to the homopolymer on the substrate to generate patterned material on the substrate, wherein the removal agent is effective to remove the homopolymer, but is not effective to remove the material in the oxidized homopolymer from the substrate.

\* \* \* \* \*